(12) United States Patent
Jaladanki et al.

(10) Patent No.: US 11,799,427 B2
(45) Date of Patent: Oct. 24, 2023

(54) AMPLIFIER CAPACITIVE LOAD COMPENSATION

(71) Applicant: TEXAS INSTRUMENTS INCORPORATED, Dallas, TX (US)

(72) Inventors: Vishnuvardhan Reddy Jaladanki, Secunderabad (IN); Preetam Charan Anand Tadeparthy, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 42 days.

(21) Appl. No.: 17/514,087

(22) Filed: Oct. 29, 2021

(65) Prior Publication Data
US 2022/0149792 A1 May 12, 2022

(30) Foreign Application Priority Data
Nov. 12, 2020 (IN) .............................. 202041049453

(51) Int. Cl.
*H03F 3/04* (2006.01)
*H02M 3/155* (2006.01)
*H03F 3/50* (2006.01)
*H03F 3/45* (2006.01)
*H03F 1/08* (2006.01)

(52) U.S. Cl.
CPC .............. *H03F 3/04* (2013.01); *H02M 3/155* (2013.01); *H03F 1/086* (2013.01); *H03F 3/45192* (2013.01); *H03F 3/505* (2013.01); *H03F 2203/45124* (2013.01)

(58) Field of Classification Search
CPC ........ H03F 3/04; H03F 1/086; H03F 3/45192; H03F 3/505; H03F 2203/45124; H02M 3/155
USPC .......................................... 330/310, 252–261
See application file for complete search history.

(56) References Cited

U.S. PATENT DOCUMENTS

| 10,768,647 | B2 * | 9/2020 | Vareljian | G05F 1/575 |
| 10,996,699 | B2 * | 5/2021 | Liu | G05F 1/575 |
| 11,316,504 | B2 * | 4/2022 | Kawashima | H03K 5/08 |

* cited by examiner

*Primary Examiner* — Hieu P Nguyen
(74) *Attorney, Agent, or Firm* — Charles F. Koch; Frank D. Cimino

(57) ABSTRACT

An amplifier includes a first stage and a second stage. The first stage is configured to amplify a received signal. The second stage is coupled to the first stage. The second stage includes a source follower and a compensation network. The source follower includes an input and an output. The compensation network is coupled to the input of the source follower and the output of the source follower. The compensation network is configured to modify a magnitude and phase response of the first stage based on a load capacitance coupled to the output of the source follower.

13 Claims, 10 Drawing Sheets

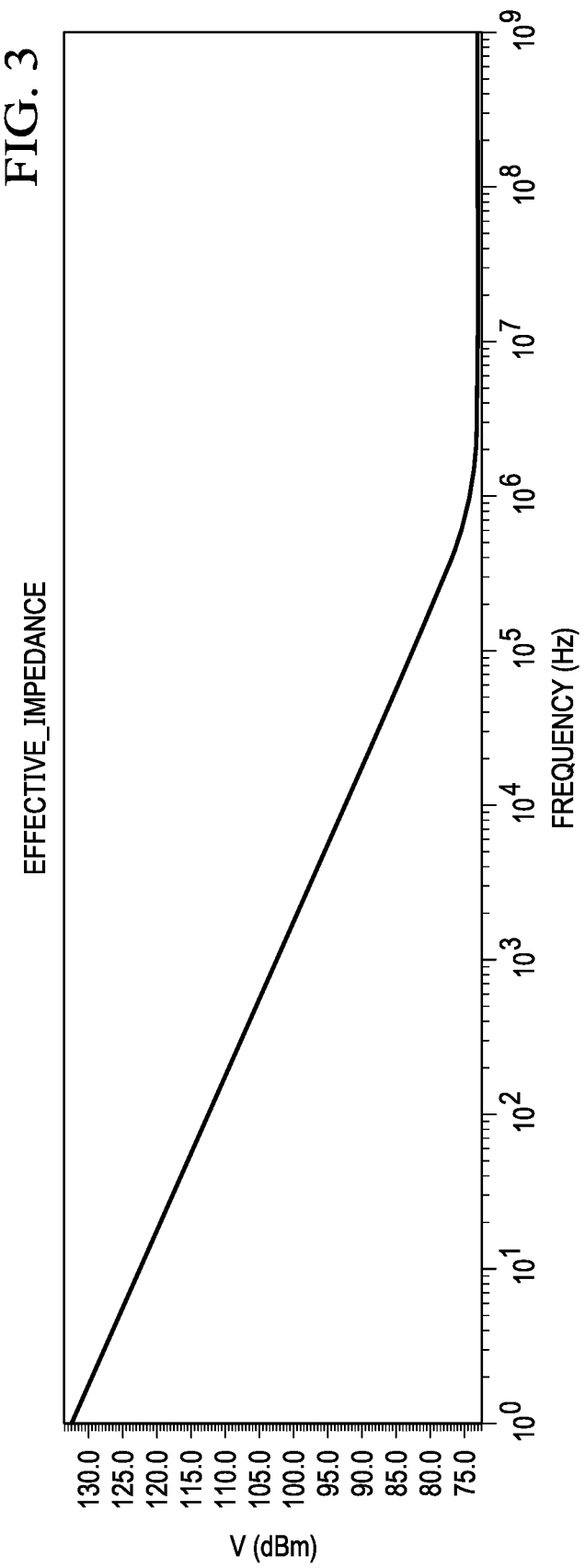

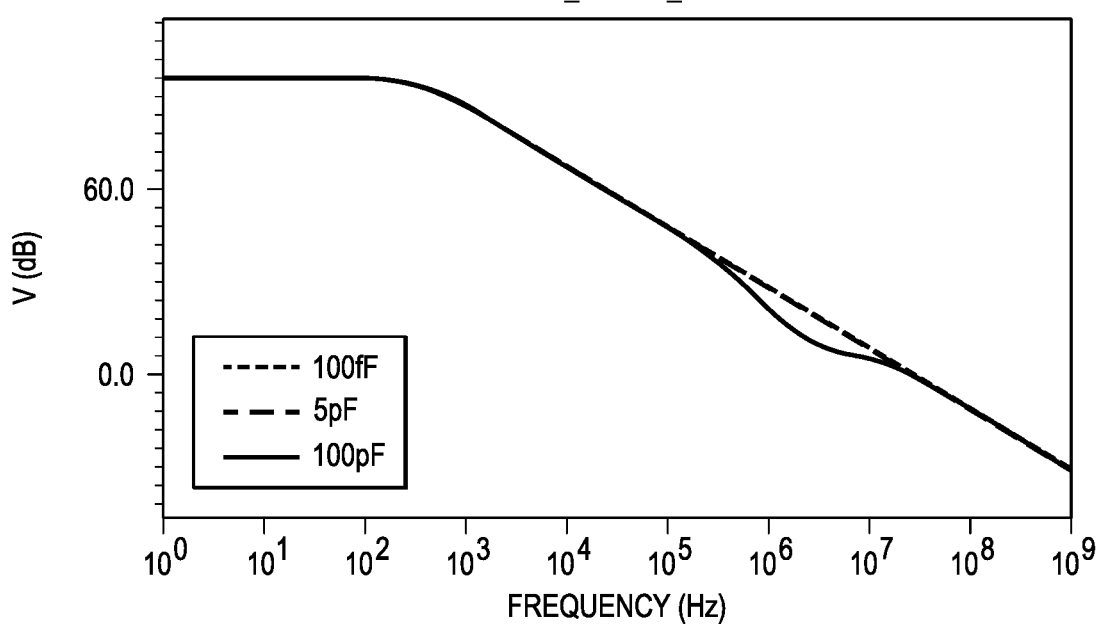
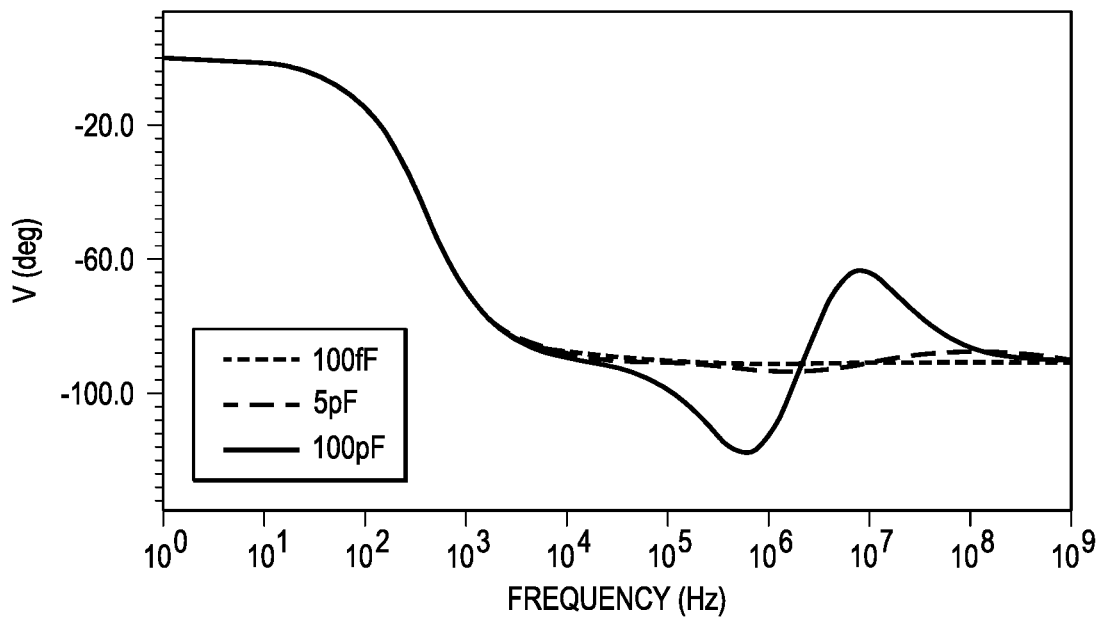
FIG. 4

AMPLIFIER CAPACITIVE LOAD COMPENSATION

CROSS-REFERENCE TO RELATED APPLICATIONS

This application claims priority to India Provisional Application No. 202041049453, filed Nov. 12, 2020, entitled "Novel Compensation Scheme for Driving Wide Range of Capacitive Loads," which is hereby incorporated by reference in its entirety.

BACKGROUND

Amplifiers are used in a wide variety of applications. An operational amplifier (op-amp) is a very familiar and widely used building-block form of amplifier that typically provides very large gain from its difference-sensing input terminals to its single output terminal, so that its input-to-output response becomes essentially the inverse function of a provided feedback network connected from the single output back to an inverting input terminal.

SUMMARY

In one example, an amplifier includes a first stage and a second stage. The first stage includes an output, and a first compensation network coupled to the output of the first stage. The second stage includes a source follower, and a second compensation network. The source follower includes an input and an output. The input of the source follower is coupled to the output of the first stage. The second compensation network is coupled between the input of the source follower and the output of the source follower.

In another example, an amplifier includes a first stage and a second stage. The first stage is configured to amplify a received signal. The second stage is coupled to the first stage. The second stage includes a source follower and a compensation network. The source follower includes an input and an output. The compensation network is coupled to the input of the source follower and the output of the source follower. The compensation network is configured to modify a magnitude and phase response of the first stage based on a load capacitance coupled to the output of the source follower.

In a further example, a DC-DC converter includes a controller and a power stage. The power stage is coupled to the controller. The power stage includes an amplifier. The amplifier includes a first stage and a second stage. The first stage is configured to amplify a received signal. The second stage is coupled to the first stage. The second stage includes a source follower and a compensation circuit. The source follower includes an input and an output. The compensation network is coupled to the input and the output of the source follower. The compensation network is configured to modify a magnitude and phase response of the first stage based on a load capacitance coupled to the output of the source follower.

BRIEF DESCRIPTION OF THE DRAWINGS

FIG. 3 is a graph of the output impedance of the first stage of the amplifier of FIG. 1.

FIG. 4 is a graph of response of the first stage of the amplifier of FIG. 1 for a range of load capacitance.

DETAILED DESCRIPTION

Figure 1:
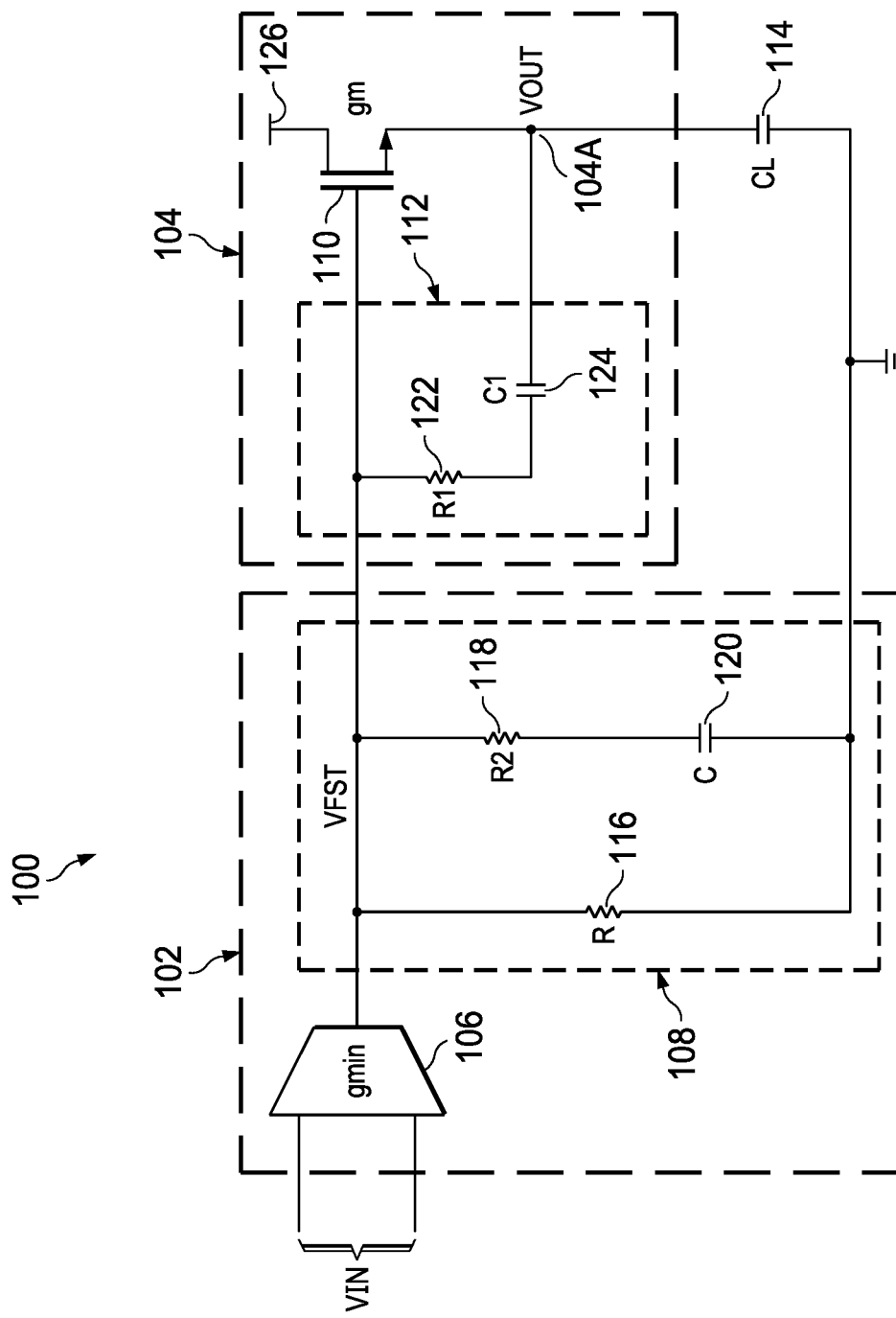
FIG. 1 is a schematic level diagram for an example amplifier that includes compensation as described herein.

In amplifiers intended to drive a variable load, compensation for the wide variation in load capacitance may be challenging as the location of the load pole varies with load capacitance. An amplifier intended to drive a capacitive load may include multiple stages, where the initial stages provide high gain, and the final stage provide a low impedance for driving the capacitive load. To ensure stability when operating with a potentially wide variation in load capacitance, some amplifiers may include dominant pole compensation or Miller compensation to make the first stage pole dominant and the load pole non-dominant.

An amplifier employing dominant pole compensation includes a first stage having a transconductance driving a compensation network include a capacitor and resistors. A second stage provides a low output impedance for driving the output load capacitance.

An amplifier employing Miller compensation includes a first stage including a transconductance driving a first compensation network, and a second (gain) stage with a second compensation network connected across the gain component of the second stage. Capacitance on the first stage will be increased due to the Miller effect on the capacitor connected across the gain component. Miller compensation has a zero that is controlled by adjusting a resistor of the second compensation network. The second stage provides sufficient gain to reduce the compensation capacitance and move the output (non-dominant) pole to higher frequencies (due to high resistance of second stage). Overall, using Miller Compensation achieves pole splitting where the dominant (first stage) pole is moved in and the non-dominant (output) pole is moved out.

In both dominant pole compensation and Miller compensation, the first stage pole is placed in such a way that, even for the maximum load capacitance value, the first stage pole will be dominant. Sufficient margins may be provided, even with maximum load capacitance, by inserting a zero in the system. In both dominant pole and Miller compensation, the zero position is fixed independent of the load capacitance. However, determining the dominant pole location based on the maximum load capacitance limits the unity gain bandwidth (UGB) of the amplifier under low load conditions. Moreover, as load capacitance changes, compensation values also need to change to maintain stability. That is, for given compensation resistance and capacitance values, stability can be achieved for only a small range of load capacitance.

The amplifiers described herein include compensation that can be applied with a wide range of load capacitance. With the compensation, the output impedance of a first stage of the amplifier changes based on the load capacitance. At lower output capacitance values, the second stage does not load the first stage, and the pole is decided by the first stage output impedance. With high load capacitance values there is a zero due to the impedance connected between the first and second stages of the amplifier to improve stability. The compensation modulates the output impedance of the first stage based on the load capacitance.

FIG. 1 is a schematic level diagram for an example amplifier 100 that includes compensation as described herein. The amplifier 100 includes a first stage 102 and a second stage 104. The first stage 102 includes a transconductance amplifier 106 and a compensation network 108. The transconductance amplifier 106 amplifies a signal (VIN) received at an input of the transconductance amplifier 106. The compensation network 108 is coupled to an output of the transconductance amplifier 106. The compensation network 108 includes a resistor 116, a resistor 118, and a capacitor 120. The resistor 116 is coupled between the output of the transconductance amplifier 106 and ground. That is, a first terminal of the resistor 116 is coupled to the output of the transconductance amplifier 106, and a second terminal of the resistor 116 is coupled to ground. The resistor 118 and the capacitor 120 are connected in series, and coupled between the output of the transconductance amplifier 106 and ground. That is, a first terminal of the resistor 118 is coupled to the output of the transconductance amplifier 106, a second terminal of the resistor 118 is coupled to a first terminal of the capacitor 120, and a second terminal of the capacitor 120 is coupled to ground.

The second stage 104 includes a transistor 110 and a compensation network 112. The transistor 110 is configured as a source follower. The transistor 110 may be an N-type field effect transistor. A first current terminal (drain) of the transistor 110 is coupled to a power supply terminal 126. A second current terminal (source) of the transistor 110 is coupled to an output terminal 104A of the second stage 104. A control terminal (gate) of the transistor 110 is coupled to the output of the transconductance amplifier 106. The transistor 110 drives the load capacitance 114 coupled to the output terminal 104A of the second stage 104.

The compensation network 112 includes a resistor 122 and a capacitor 124 connected in series, and coupled between the control terminal of the transistor 110 and the output 104A of the second stage 104. That is, a first terminal of the resistor 122 is coupled to the control terminal of the transistor 110, and a second terminal of the resistor 122 is coupled to a first terminal of the capacitor 124. A second terminal of the capacitor 124 is coupled to the second current terminal of the transistor 110.

The input impedance of the second stage 104 (which is the output impedance of the first stage 102) may be computed as:

$$Z_{IN} = \frac{\left(\frac{sC1}{gm}\right) + \left(1 + \frac{sCL}{gm}\right)(1 + sR1C1)}{\left(\frac{sC1}{gm}\right) * (sCL)} \quad (1)$$

where:
C1 is the capacitance of the capacitor 124;
CL is the value of the load capacitance 114;
R1 is the resistance of the resistor 122; and
gm is the transconductance of the transistor 110.

Equation (1) shows that for low values of load capacitance, the capacitance looking into the second stage 104 is very high (i.e., there is no loading on the first stage 102).

With the value of the load capacitance 114 high and the resistance of the resistor 122 low, the input impedance of the second stage 104 may be approximated as:

$$Z_{IN} \sim \frac{(C1 + CL)}{s(CL*C1)} \quad (2)$$

Figure 2:
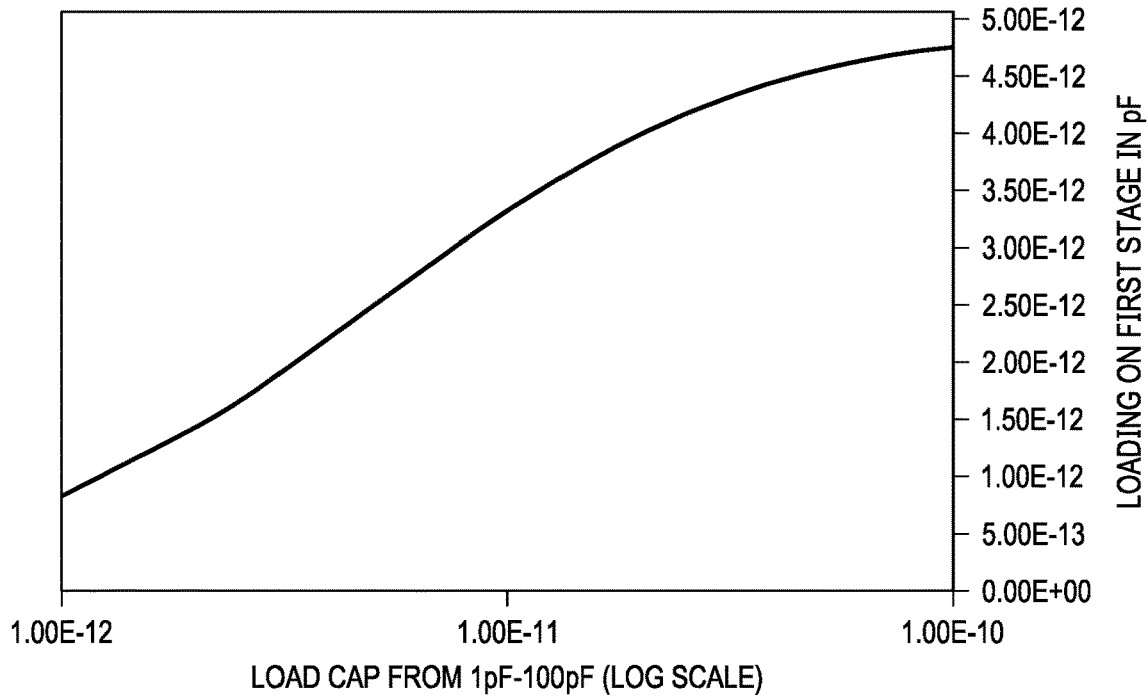
FIG. 2 shows an example of the effective output capacitance of the first stage or the input capacitance of the second stage of the amplifier of FIG. 1 with a wide range of load capacitance.

Equation (2) shows that, for high load capacitance 114, the input capacitance of the second stage 104 is the series combination of the capacitance of the capacitor 124 and the load capacitance 114. Because the load capacitance 114 is large, the input capacitance of the second stage 104 may be approximated as the capacitance of the capacitor 124. FIG. 2 shows an example of the effective input capacitance of the second stage 104 with a range of load capacitance 114 (1-100 pf) and a capacitor 124 of 5 pf. With the capacitor 124 having a value of 5 pf, the input capacitance of the second stage 104 ranges from about 0.75 pf to about 4.75 pf as the load capacitance 114 increases from about 1 pf to about 100 pf. Thus, for lower values of the load capacitance 114, the input capacitance of the second stage 104 is very low, and the input capacitance of the second stage 104 increases with increasing load capacitance 114 until the entire capacitance of the capacitor 124 appears as the input capacitance of the second stage 104.

With a high value of load capacitance 114 (relative to the capacitance of the capacitor 124) and the resistance of the resistor 122 being finite, the input impedance of the second stage 104 may be approximated as:

$$Z_{IN} \sim \frac{sC1 + sCL(1 + sR1C1)}{(sCL*sC1)} \quad (3)$$

FIG. 3 shows a graph of input impedance of the second stage 104. In FIG. 3, the load capacitance 114 is 100 pf, the capacitance of the capacitor 124 is 10 pf, and the resistance of the resistor 122 is 20 kilo-ohms. In FIG. 3, at low frequencies, the effective impedance of the first stage 102 is dominated by the capacitance. At about 500 kilohertz, the resistance and capacitance contribute equally, making the effective input impedance about 40 kilo-ohms. Beyond about 3 megahertz, the response is dominated by the resistance of the resistor 122.

With infinite load capacitance 114, and finite value of the resistor 122 and the capacitor 124, the input impedance of the second stage 104 (the output capacitance of the first stage) is the series combination of the resistance of the resistor 122 and the capacitance of the capacitor 124.

$$Z_{IN} = \frac{(1 + sR1C1)}{(sC1)} \quad (4)$$

The output impedance of the second stage 104 may be expressed as:

$$Z_{OUT} = \frac{1}{gm + sCL + (sC1)/(1 + sR1C1)} \quad (6)$$

Output impedance can be viewed as the parallel combination of the transconductance of the transistor 110, the load capacitance 114, and the series combination of the resistor 122 and the capacitor 124. The effective transconductance may be expressed as:

$$GM_{Effective} = \frac{gm(1 + sR1C1) + sC1}{(1 + sR1C1)} \quad (7)$$

The gain of the second stage 104 may be expressed as:

$$AV = GM_{Effective} * A_{OUT} \quad (8)$$

The effective impedance of the first stage 102 (ZFirst) may be expressed as:

$$ZFirst = \frac{R(1 + sR2C)\left[\left(1 + \frac{sCL}{gm}\right)(1 + sR1C1) + \frac{sC1}{gm}\right]}{R(1 + sR2C)\left(\frac{sC1}{gm}\right) * (sCL) +} \quad (9)$$

$$[1 + s(R + R2)C]\left[\left(1 + \frac{sCL}{gm}\right)(1 + sR1C1) + \frac{sC1}{gm}\right]$$

Output voltage of the first stage 102 (VFirst) may be expressed as:

$$VFirst = \frac{gmin * VIN * R(1 + sR2C)\left[\left(1 + \frac{sCL}{gm}\right)(1 + sR1C1) + \frac{sC1}{gm}\right]}{R(1 + sR2C)\left(\frac{sC1}{gm}\right) * (sCL) +} \quad (10)$$

$$[1 + s(R + R2)C]\left[\left(1 + \frac{sCL}{gm}\right)(1 + sR1C1) + \frac{sC1}{gm}\right]$$

Output (VOUT) of the amplifier 100 may be expressed as:

$$VOUT = \frac{VFirst * (1 + sR1C1) + \left(\frac{sC1}{gm}\right)}{\left(1 + \frac{sCL}{gm}\right)(1 + sR1C1) + \frac{sC1}{gm}} \quad (11)$$

Using VFirst, from equation (10), in equation (11), the overall transfer function of the amplifier 100 can be expressed as:

$$\frac{VOUT}{VIN} = \frac{gmin * R(1 + sR2C)\left[\left(1 + \frac{sCL}{gm}\right)(1 + sR1C1) + \frac{sC1}{gm}\right]}{R(1 + sR2C)\left(\frac{sC1}{gm}\right) * (sCL) +} * \quad (12)$$

$$[1 + s(R + R2)C]\left[\left(1 + \frac{sCL}{gm}\right)(1 + sR1C1) + \frac{sC1}{gm}\right]$$

$$\frac{(1 + sR1C1) + \left(\frac{sC1}{gm}\right)}{\left(1 + \frac{sCL}{gm}\right)(1 + sR1C1) + \frac{sC1}{gm}}$$

For very low values of the load capacitance 114, the overall transfer function can be simplified as:

$$\frac{VOUT}{VIN} = \frac{gmin * R(1 + sR2C)}{(1 + s(R + R2)C)} \quad (13)$$

Equation (13) shows that the amplifier 100 provides single pole response if the resistance of the resistor 118 is zero, provides pole-zero response if the resistance of the resistor 118 is finite, and provides no zero due the resistor 122 and the capacitor 124.

For very high values of the load capacitance 114, the transfer function can be expressed as:

$$\frac{VOUT}{VIN} = \frac{gmin * R(1 + sR2C)[gm(1 + sR1C1) + sC1]}{[sRC1(1 + sR2C) + (1 + sR1C1)(1 + s(R + R2)C)] * sCL} \quad (14)$$

Equation (14) shows that the amplifier 100 has three poles and two zeros with very high values of the load capacitance 114. One zero is due to the compensation network 112, and the other zero is due to the compensation network 108. In various implementations of the amplifier 100, the values of the resistor 118, the capacitor 120, the resistor 122, and the capacitor 124 may be selected such that one of the pole zeros track, reducing overall response to two poles and one zero.

FIG. 4 shows response of the first stage 102 for different values of the load capacitance 114, a resistor 122 of 20 kilo-ohms, and a capacitor 124 of 5 pf. With a load capacitance 114 of 100 femto-farads (ff), the compensation network 112 and the load capacitance 114 have no effect on the response of the first stage 102. For a load capacitance 114 of 5 pf, as the second stage 104 starts rolling off, the first stage sees slightly more attenuation and recovers at the load output pole position (zero @ load pole), and there is a zero due to the compensation elements (depends on load cap magnitude). For 100 pf of load capacitance 114, the zero due to the compensation network 112 moves as the loading of the first stage 102 increases. For all values of the load capacitance 114, the first stage 102 has a single pole response and similar UGB with the same dominant pole position (independent of the compensation network 112). Since the UGB is about the same (about 21 MHz) across varying load capacitance 114, and the zero is moved in, there is a phase boost for higher values of the load capacitance 114. Phase margin for load capacitance 114 of 100 ff, 5, pf, and 100 pf is 90°, 92°, and 118° respectively.

Figure 5:
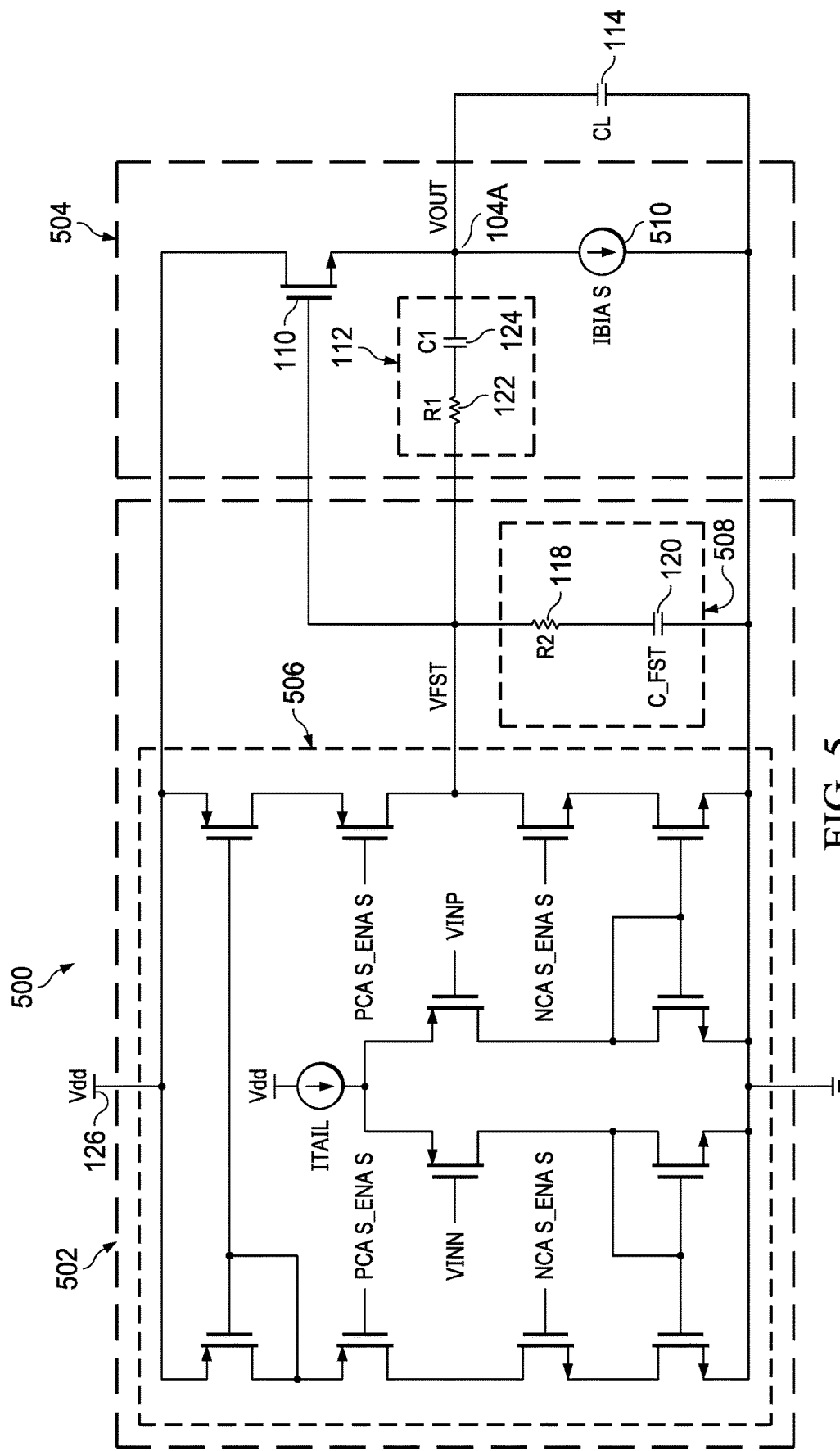
FIG. 5 is a schematic level diagram for an example amplifier that includes compensation as described herein.

FIG. 5 is a schematic level diagram for an example amplifier 500. The amplifier 500 is an implementation of the amplifier 100. The amplifier 500 includes a first stage 502 (input stage) and a second stage 504 (output stage). The first stage 502 is an implementation of the first stage 102, and the second stage 504 is an implementation of the second stage 104. The second stage 504 includes the transistor 110 configured as a source follower and the compensation network 112 coupled between a gate and source of the transistor 110. The second stage 504 also includes a current source 510 coupled to the source of the transistor 110.

The first stage 502 includes a transconductance amplifier 506 and a compensation network 508. The transconductance amplifier 506 is an implementation of the transconductance amplifier 106. The compensation network 508 is an implementation of the compensation network 108. The transconductance amplifier 506 includes a tail current source, a differential pair, and bias circuitry. In some implementations of the amplifier 500 the first stage 502 may include different transconductance amplifier circuitry.

Figure 6:
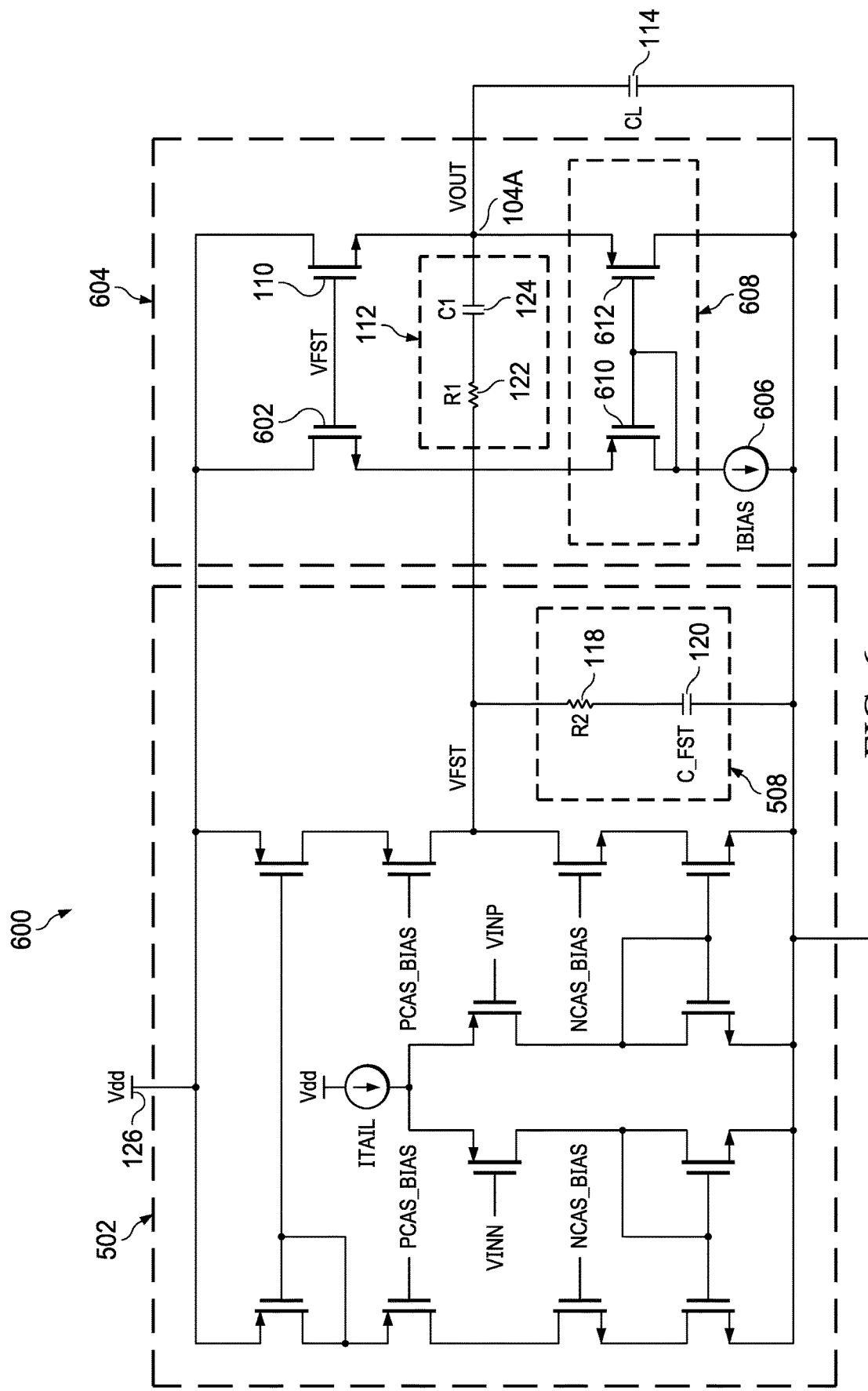
FIG. 6 is a schematic level diagram for an amplifier that sources and sinks current, and that includes compensation as described herein.

FIG. 6 shows a schematic level diagram for an example amplifier 600. The amplifier 600 is similar to the amplifier 500 and includes source-sink capability. The amplifier 600 includes the first stage 502 (input stage) and a second stage 604 (output stage). The second stage 604 includes the transistor 110 and the compensation network 112 coupled across the gate and source of the transistor 110. The second stage 604 also includes a transistor 602, a current mirror circuit 608, and a current source 606. The transistor 602 includes a current terminal (drain) coupled to the power supply terminal 126, and a control terminal (gate) coupled to the control terminal of the transistor 110. The current mirror circuit 608 includes a transistor 610 and a transistor 612 A first current terminal (source) of the transistor 610 is coupled to a second current terminal (source) of the transistor 602. A second current terminal (drain) of the transistor 610 is coupled to the current source 606 and to the control terminal (gate) of the transistor 610. A first current terminal (source) of the transistor 612 is coupled to the second current terminal (source) of the transistor 110 to sink current from the output terminal 104A. A second current terminal (drain) of the transistor 612 is coupled to ground. A control terminal (gate) of the transistor 612 is coupled to the control terminal of the transistor 610.

Figure 7:
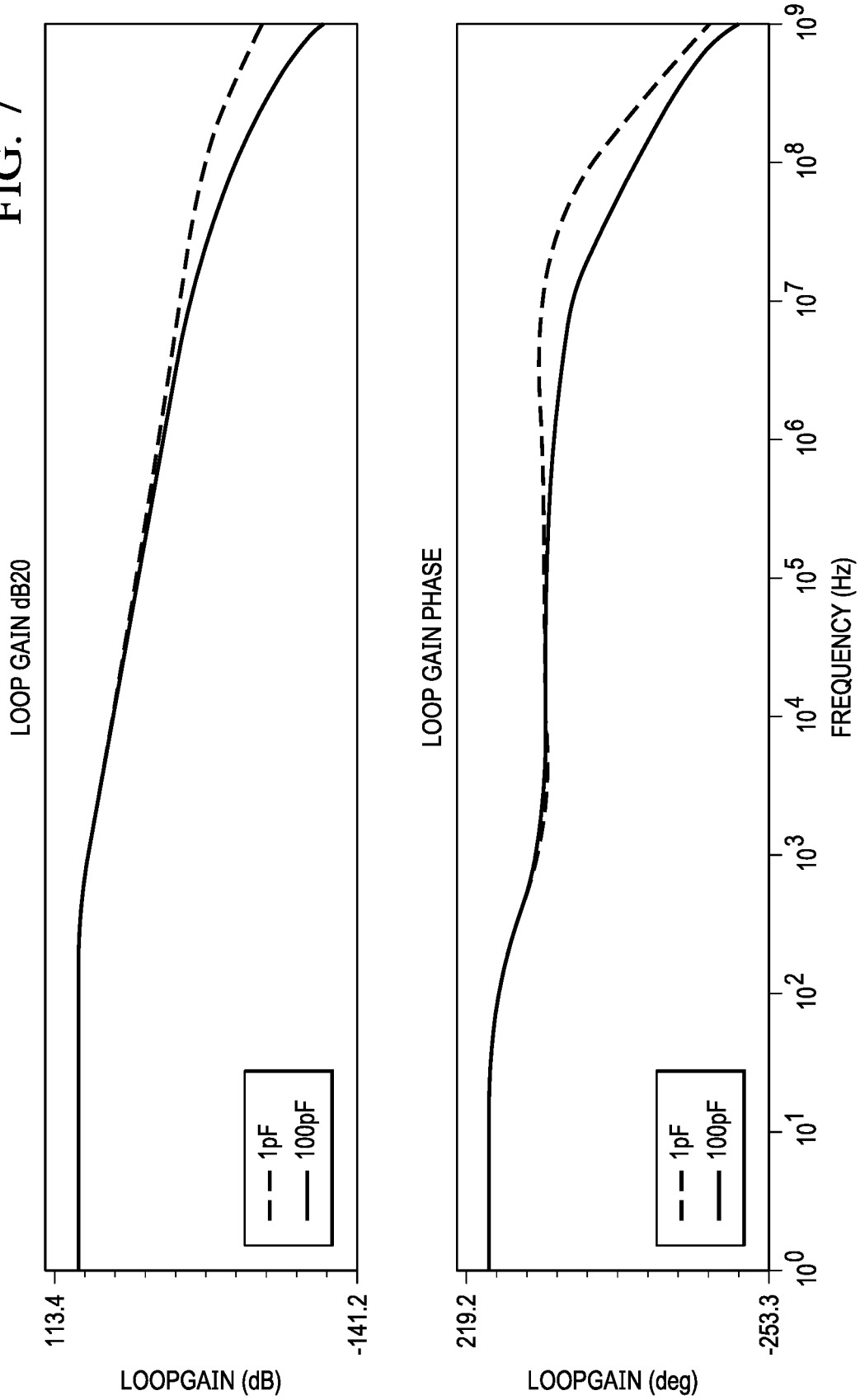
FIG. 7 is a graph of AC response of the amplifier of FIG. 6 with low and high load capacitance.

FIG. 7 is a graph of response of the amplifier 600 with low and high load capacitance 114. The amplifier 100 and the amplifier 500 have similar response. In FIG. 7, low load capacitance 114 is 1 pf, and high load capacitance 114 is 100 pf. With 1 pf load capacitance 114, the UGB is about 20.6 MHz, and the phase margin is about 79.7°. With 100 pf load capacitance 114, the UGB is about 7.5 MHz, and the phase margin is about 54.3°. FIG. 7 shows that the dominant pole is independent of the load capacitance 114 and the compensation network 112. For low load capacitance 114, the UGB is higher with sufficiently high phase margin. For higher load capacitance 114, the load pole moves along with the zero due to the compensation network 112, thereby providing improved UGB and phase margin.

Figure 8:
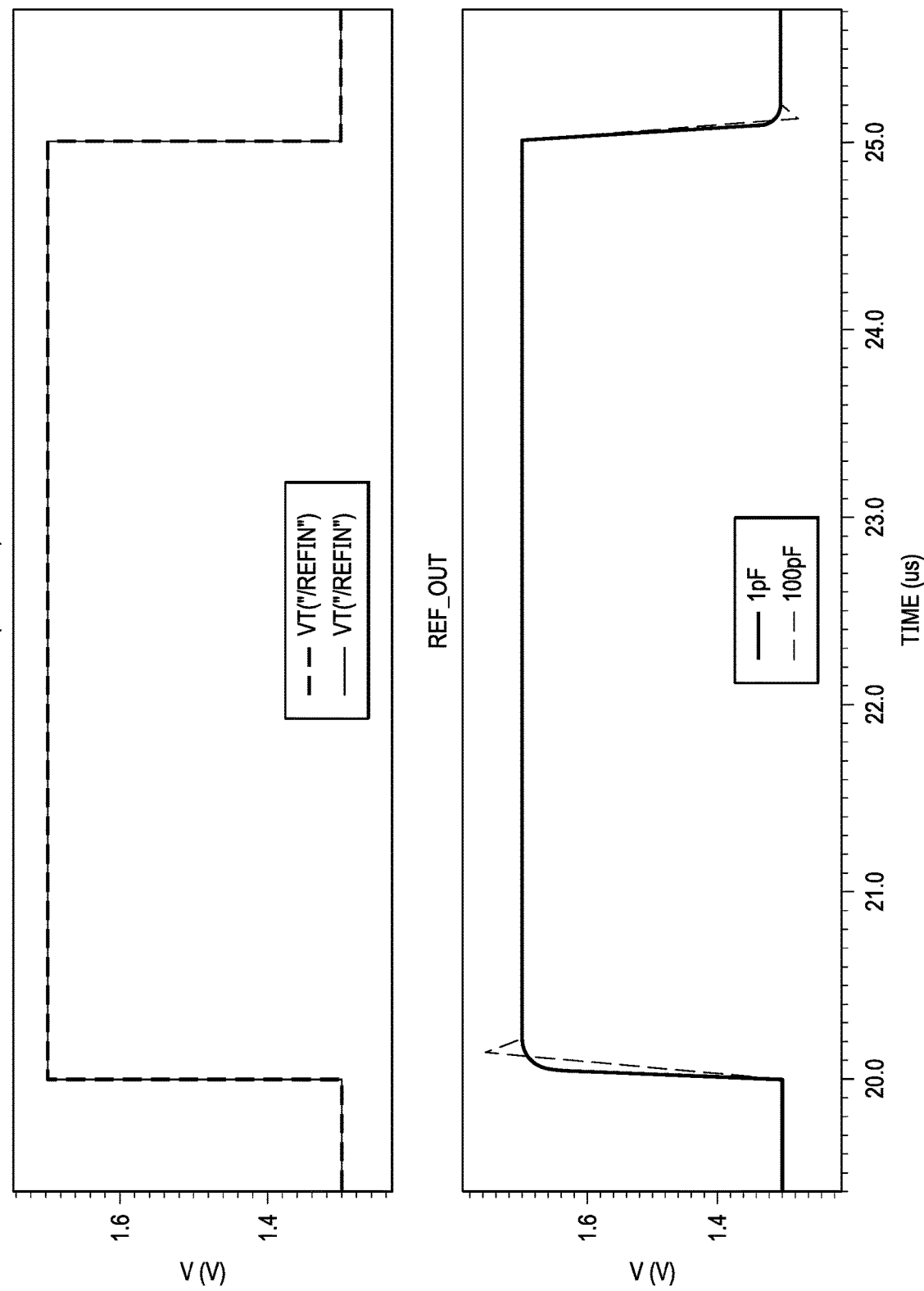
FIG. 8 is a graph of transient response of the amplifier of FIG. 6 with low and high load capacitance.

FIG. 8 is a graph of transient response of the amplifier 600 with low and high load capacitance 114. The amplifier 100 and the amplifier 500 have similar response. In FIG. 8, low load capacitance 114 is 1 pf, and high load capacitance 114 is 100 pf. Transient input to the amplifier 100 is a +/−200 millivolt step in 1 nanosecond on 1.5 volts. With the higher load capacitance 114, the UGB of the amplifier 100 is reduced, which increases settling time. However, the settling behavior is the same with low or high load capacitance 114, in that output signal settles with a single ring for both low and high load capacitance 114.

Figure 9:
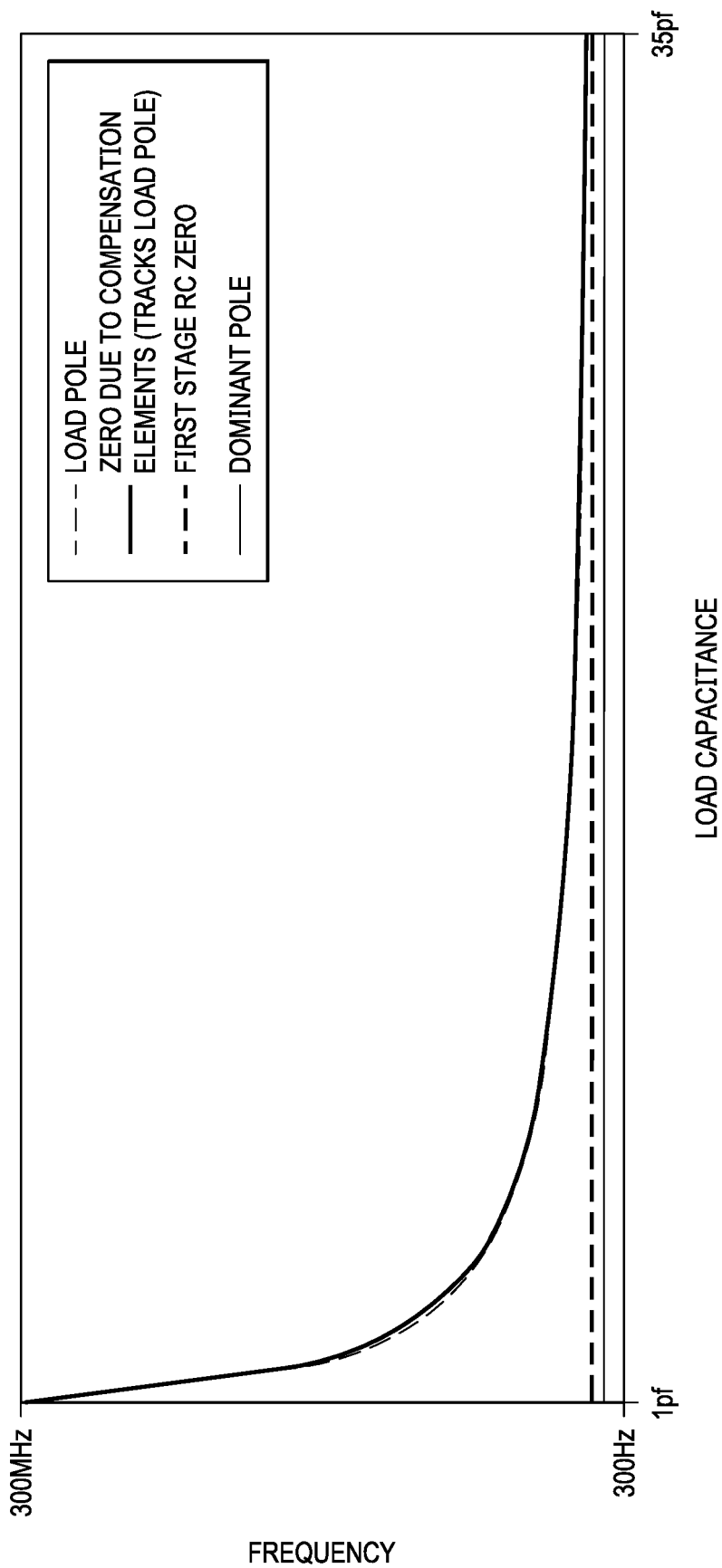
FIG. 9 is a graph showing movement of the different poles and zeros of the amplifier of FIG. 1 with load capacitance varying from low to high.

FIG. 9 is a graph showing movement of the different poles and zeros of the amplifier 100 with the load capacitance 114 varying from low to high. In FIG. 9, the load capacitance 114 varies from 1 pf to 35 pf. The zero of the compensation network 108, and the dominant pole are generally constant across frequency. The zero due the compensation network 112 tracks the load pole.

Figure 10:
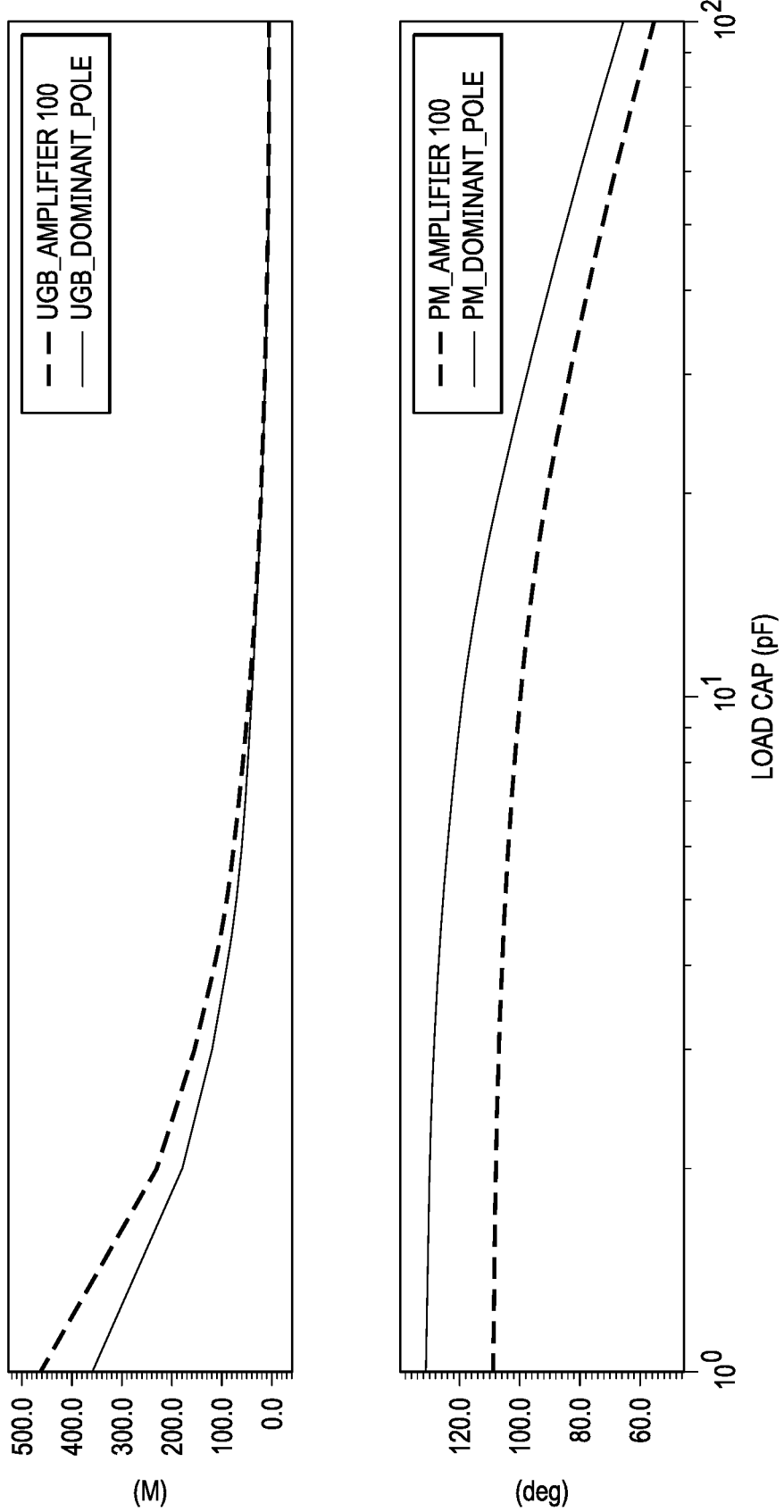
FIG. 10 is a graph showing unity gain bandwidth and phase margin in the amplifier of FIG. 1, and in an amplifier with conventional compensation circuitry.

FIG. 10 is a graph showing UGB and phase margin in the amplifier 100, and in an amplifier with conventional compensation circuitry. In FIG. 10, load capacitance varies from 1 pf to 100 pf. In the amplifier 100, the second stage 104 does not load the first stage 102 until the source follower rolls off, which provides improved UGB for lower values of the load capacitance 114. With conventional compensation circuitry, the location of the dominant pole is determined based on high load capacitance, which pushes the dominant pole lower even for low load capacitance, and limits the UGB. FIG. 10 shows that the amplifier 100 provides significantly better UGB than the conventional compensation with light load capacitance, and the amplifier 100 provides similar UGB to the convention compensation with high load capacitance. The amplifier 100 provides worst case phase margin of about 56°, while worst case phase margin with conventional compensation is about 64°.

Figure 11:
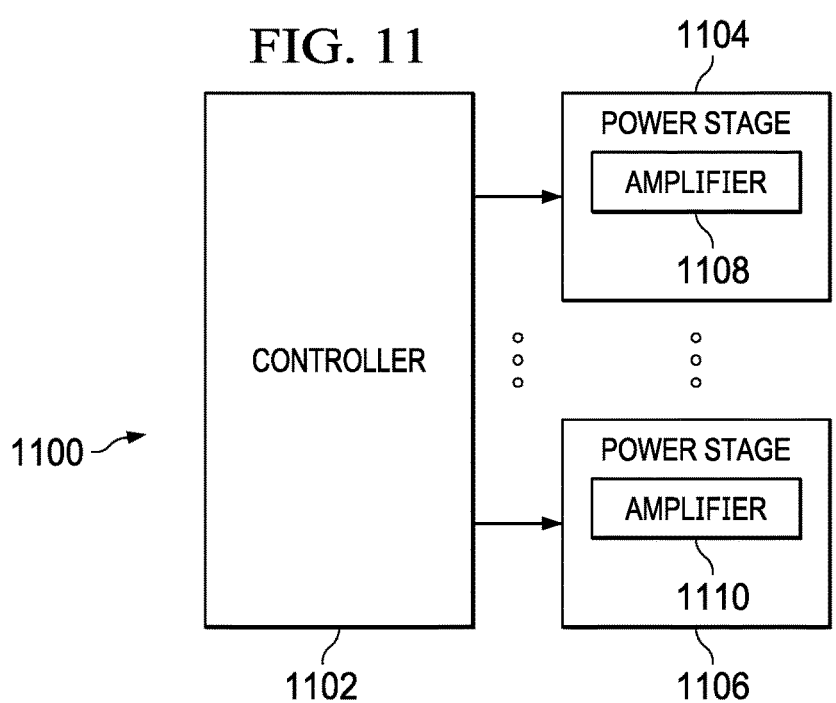
FIG. 11 is a block diagram for an example DC-DC converter that includes an implementation of the amplifier described herein.

FIG. 11 is a block diagram for an example DC-DC converter 1100 that includes an implementation of the amplifier described herein. The DC-DC converter 1100 is a multi-phase converter, and includes a controller 1102, a power stage 1104, and a power stage 1106. In practice, the DC-DC converter 1100 may include one or more power stages (e.g., 2 power stages, 4 power stages, 6 power stages, etc.). The controller 1102 generates and provides to each power stage, a control signal, (e.g., a pulse width modulated control signal) for controlling the switching of the power transistors of the power stage.

The power stage 1104 includes an amplifier 1108, and the power stage 1106 includes an amplifier 1110. The power stage 1104 may be similar or identical to the power stage 1106. The amplifier 1108 and the amplifier 1110 may be implementations of the amplifier 100, the amplifier 500, or the amplifier 600. The amplifier 1108 may be incorporated in current sense circuitry within the power stage 1104 and provide improved response in reporting sensed current. The amplifier 1110 may provide similar or identical functionality in the power state 1106.

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. An amplifier, comprising:
    a first stage including:
        an output;
        a first compensation network coupled to the output of the first stage;
    a second stage including:
        a source follower including:
            an input coupled to the output of the first stage; and
            an output; and
        a second compensation network coupled between the input of the source follower and the output of the source follower;
    wherein:
        the source follower includes a first transistor having:
            a first current terminal coupled to a power supply terminal;
            a second current terminal coupled to the second compensation network; and
            a control terminal coupled to the output of the first stage; and the second stage includes:
  a second transistor including:
    a first current terminal coupled to the first current terminal of the first transistor;
    a control terminal coupled to the control terminal of the first transistor; and
    a second current terminal; and
  a current mirror circuit coupled to the second current terminal of the first transistor and the second current terminal of the second transistor, wherein the current mirror circuit includes:
    a third transistor including:
      a first current terminal coupled to the second current terminal of the first transistor;
      a second current terminal coupled to ground; and
      a control terminal; and
    a fourth transistor including:
      a first current terminal coupled to the second current terminal of the second transistor;
      a control terminal coupled to the control terminal of the third transistor; and
      a second current terminal coupled to the control terminal of the third transistor.

2. The amplifier of claim 1, wherein the second compensation network includes:
  a resistor including:
    a first terminal coupled to the control terminal of the first transistor; and
    a second terminal coupled to the second current terminal of the first transistor.

3. The amplifier of claim 2, wherein the second compensation network includes:
  a capacitor including:
    a first terminal coupled to the second terminal of the resistor; and
    a second terminal coupled to the second current terminal of the first transistor.

4. The amplifier of claim 1, wherein the source follower includes a current source coupled between the output of the source follower and ground.

5. The amplifier of claim 1, wherein the first compensation network includes:
  a resistor including:
    a first terminal coupled to the output of the first stage; and
    a second terminal; and
  a capacitor including:
    a first terminal coupled to the second terminal of the resistor; and
    a second terminal coupled to ground.

6. An amplifier, comprising:
  a first stage configured to amplify a received signal; and
  a second stage coupled to the first stage, and including:
    a source follower including an input and an output; and
    a compensation network between the input and the output, and configured to modify a magnitude and phase response of the first stage based on a load capacitance coupled to the output of the source follower;
  wherein:
    the source follower includes a first transistor including:
      a first current terminal coupled to a power supply terminal;
      a second current terminal coupled to ground; and
      a control terminal coupled to the first stage; and
    the second stage includes a second transistor having:
      a first current terminal coupled to the power supply terminal;
      a second current terminal coupled to ground; and
      a control terminal coupled to the control terminal of the first transistor.

7. The amplifier of claim 6, wherein the compensation network includes a capacitor coupled between the input of the source follower and the output of the source follower.

8. The amplifier of claim 7, wherein:
  the compensation network includes a resistor coupled between the input of the source follower and the output of the source follower; and
  the resistor is coupled in series with the capacitor.

9. The amplifier of claim 6, wherein the source follower includes a current source coupled between the output of the source follower and ground.

10. The amplifier of claim 9, wherein the second stage includes:
  a current mirror circuit having:
    a third transistor coupled between the first transistor and ground; and
    a fourth transistor coupled between the second transistor and ground.

11. A DC-DC converter comprising:
  a controller;
  a power stage coupled to the controller, and including:
    an amplifier having:
      a first stage configured to amplify a received signal; and
      a second stage coupled to the first stage, and including:
        a source follower, wherein the source follower includes:
          an input and an output; and
          a first transistor including:
            a first current terminal coupled to a power supply terminal;
            a second current terminal coupled to ground; and
            a control terminal coupled to the first stage;
        a compensation network coupled between the input and the output, and configured to modify a magnitude and phase response of the first stage based on a load capacitance coupled to the output of the source follower; and
        a second transistor including:
          a first current terminal coupled to the power supply terminal;
          a second current terminal coupled to ground; and
          a control terminal coupled to the control terminal of the first transistor.

12. The DC-DC converter of claim 11, wherein the compensation network includes a capacitor and a resistor coupled in series between the input of the source follower and the output of the source follower.

13. The amplifier of claim 11, wherein the second stage includes:
  a current mirror circuit having:
    a third transistor coupled between the first transistor and ground; and
    a second transistor coupled between the second transistor and ground.

* * * * *